(12) United States Patent
Ueda

(10) Patent No.: US 7,995,379 B2
(45) Date of Patent: Aug. 9, 2011

(54) SEMICONDUCTOR MEMORY DEVICE

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 12/396,559

(22) Filed: Mar. 3, 2009

(65) Prior Publication Data

US 2009/0225586 A1  Sep. 10, 2009

(30) Foreign Application Priority Data

Mar. 6, 2008  (JP) .................. 2008-056761

(51) Int. Cl.
  *G11C 11/00*  (2006.01)
(52) U.S. Cl. ...... 365/158; 365/201; 365/208; 365/210.1
(58) Field of Classification Search .................. 365/158, 365/208, 210.1, 201
See application file for complete search history.

(56) References Cited

U.S. PATENT DOCUMENTS

| | | | |
|---|---|---|---|
| 7,161,861 B2 * | 1/2007 | Gogl et al. ................. | 365/207 |
| 7,596,032 B2 * | 9/2009 | Ogawa et al. ............ | 365/185.2 |
| 7,706,176 B2 * | 4/2010 | Dittrich .................... | 365/158 |
| 2006/0044886 A1 * | 3/2006 | Iwata et al. ............. | 365/189.09 |

FOREIGN PATENT DOCUMENTS

| JP | 5-136361 | 6/1993 |
|---|---|---|
| JP | 7-153287 | 6/1995 |
| JP | 2003-297072 | 10/2003 |
| JP | 2004-62922 | 2/2004 |
| JP | 2005-353145 | 12/2005 |

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A semiconductor memory device includes a sense amplifier that compares intensities of currents flowing through a first node and a second node with each other, a first MOSFET having a drain terminal connected with the first node, a second MOSFET having a drain terminal connected with the second node, a memory cell connected with a source terminal of the first MOSFET, and a reference cell. The semiconductor memory device further includes a connection control circuit that connects a source terminal of the second MOSFET with the reference cell at the time of a regular operation and connects the source terminal of the second MOSFET with a reference voltage terminal at the time of a test operation.

19 Claims, 8 Drawing Sheets

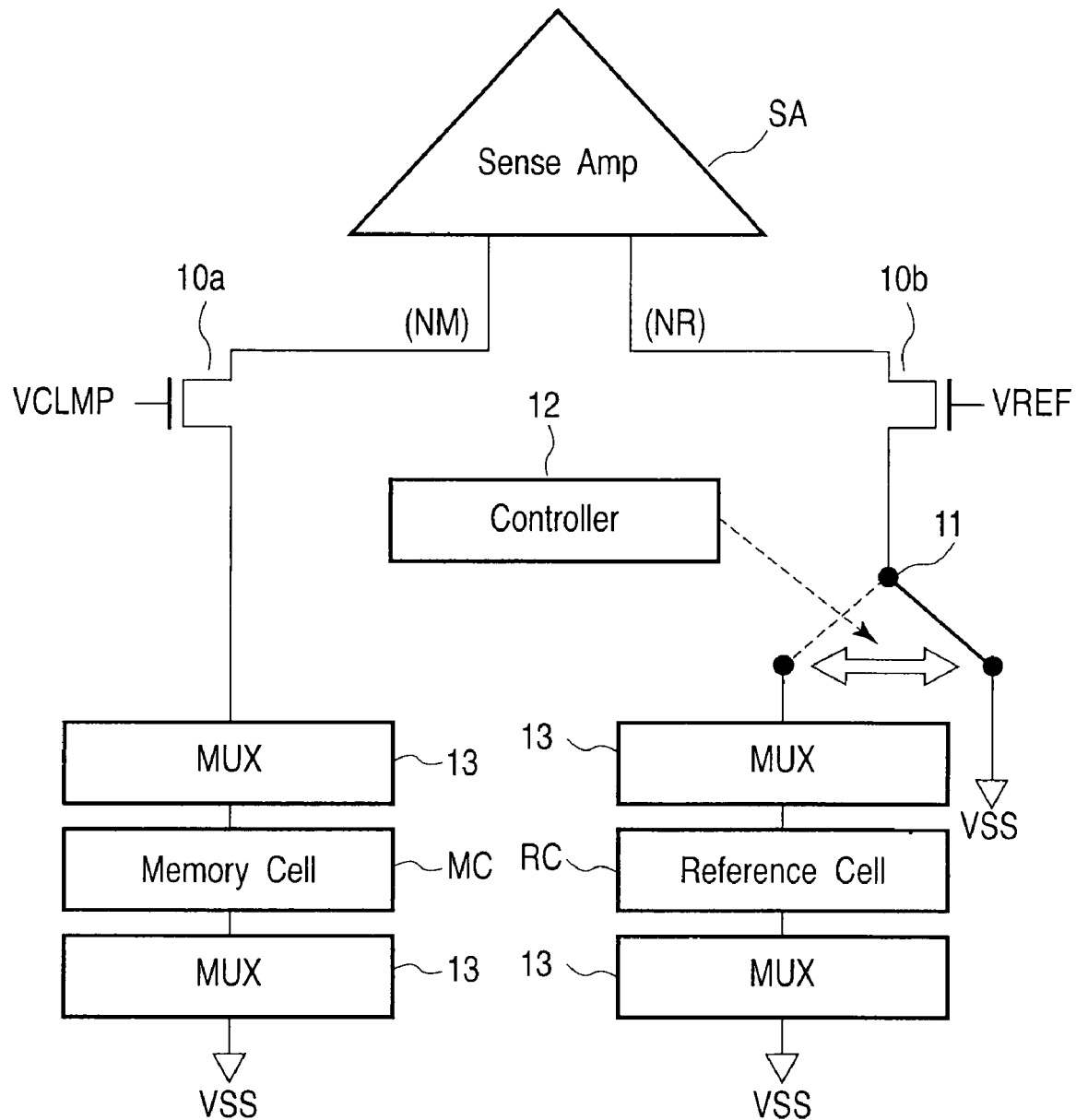
F I G. 3

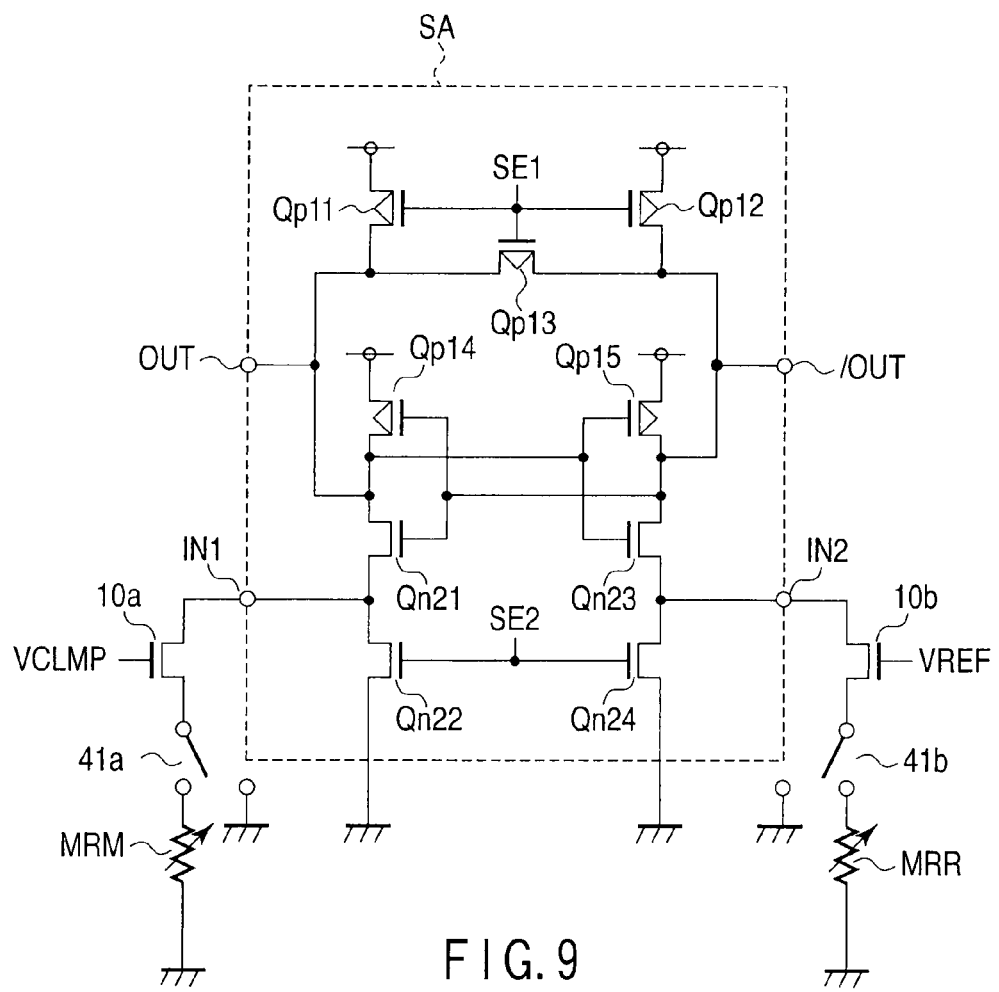
F I G. 9
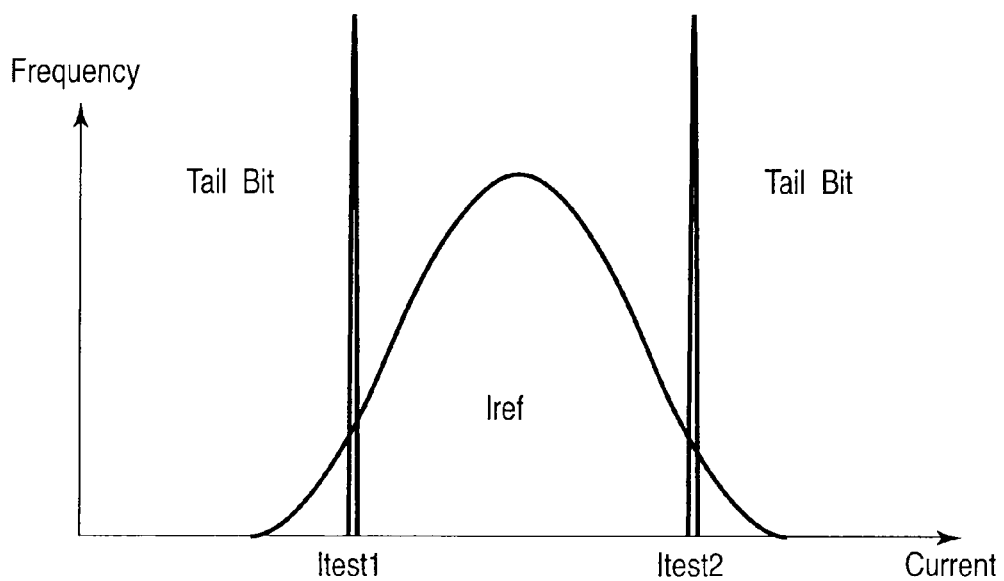
F I G. 10

US 7,995,379 B2

SEMICONDUCTOR MEMORY DEVICE

CROSS-REFERENCE TO RELATED APPLICATIONS

This application is based upon and claims the benefit of priority from prior Japanese Patent Application No. 2008-056761, filed Mar. 6, 2008, the entire contents of which are incorporated herein by reference.

BACKGROUND OF THE INVENTION

1. Field of the Invention

The present invention relates to a semiconductor memory device. More particularly, the present invention relates to a resistance change memory including a test circuit.

2. Description of the Related Art

As a semiconductor memory device, a resistance change memory using a resistance change element for a memory cell is known. In reading of this resistance change memory, there is a method of determining a resistance state of the memory cell by comparing a read current flowing through the memory cell when a read voltage is applied with a reference current flowing through a reference cell when a reference voltage is applied by a current comparison circuit (a current sense amplifier). Since this method adopts a differential amplification scheme using the reference cell having the same electrical characteristics as those of the memory cell, it has an advantage that an operating range can be expanded by compensating for a change in resistance due to, e.g., a fluctuation in power supply voltage and a fluctuation in temperature. However, since a resistance of the reference cell fluctuates, the reference current also fluctuates.

It is to be noted that a thin-film magnetic substance memory device that can execute reading data by using a dummy cell configured like a normal memory cell has been already proposed in relation to the reading method of the resistance change memory (see, for example, Jpn. Pat. Appln. KOKAI Publication No. 2003-297072).

Meanwhile, in the resistance change memory, there are a bit that a resistance of a resistance change element is abnormally high (an open bit), a bit that a resistance is abnormally small (a short bit), and others as small-number defective bits. These small-number defective bits can be remedied based on substitution using a redundant bit. To realize this remedy, a small-number defective bit must be specified. As a specifying method, there is a method of using a sense amplifier to determine a resistance change element having a resistance smaller than a boundary reference current as a short bit and determine a resistance change element having a resistance larger than the boundary reference current as an open bit. However, in the case of the differential amplification scheme, since the reference current fluctuates, accurate determination of a defective bit is difficult.

BRIEF SUMMARY OF THE INVENTION

According to a first aspect of the present invention, there is provided a semiconductor memory device comprising: a sense amplifier that compares intensities of currents flowing through a first node and a second node with each other; a first metal oxide semiconductor field effect transistor (MOSFET) having a drain terminal connected with the first node; a second MOSFET having a drain terminal connected with the second node; a memory cell connected with a source terminal of the first MOSFET; a reference cell; and a connection control circuit that connects a source terminal of the second MOSFET with the reference cell at the time of a regular operation and connects the source terminal of the second MOSFET with a reference voltage terminal at the time of a test operation.

According to a second aspect of the present invention, there is provided a semiconductor memory device comprising: a sense amplifier that compares intensities of currents flowing through a first node and a second node with each other; a first metal oxide semiconductor field effect transistor (MOSFET) having a drain terminal connected with the first node; a second MOSFET having a drain terminal connected with the second node; a reference cell connected with a source terminal of the second MOSFET; a memory cell; and a connection control circuit that connects a source terminal of the first MOSFET with the memory cell at the time of a regular operation and connects the source terminal of the first MOSFET with a reference voltage terminal at the time of a test operation.

According to a third aspect of the present invention, there is provided a semiconductor memory device comprising: a sense amplifier that compares intensities of currents flowing through a first node and a second node with each other; a first metal oxide semiconductor field effect transistor (MOSFET) having a drain terminal connected with the first node; a second MOSFET having a drain terminal connected with the second node; a memory cell; a reference cell; and a connection control circuit that connects a source terminal of the first MOSFET with the memory cell and connects a source terminal of the second MOSFET with a reference cell at the time of a regular operation, wherein the connection control circuit connects the source terminal of the first MOSFET with the memory cell and connects the source terminal of the second MOSFET with a reference voltage terminal, or connects the source terminal of the second MOSFET with the reference cell and connects the source terminal of the first MOSFET with the reference voltage terminal at the time of a test operation.

BRIEF DESCRIPTION OF THE SEVERAL VIEWS OF THE DRAWING

FIG. 3 is a structural view showing a test circuit of the MRAM according to the first embodiment;

FIG. 9 is a circuit diagram showing a structural example of a sense amplifier of the MRAM according to the second embodiment; and FIG. 10 is a view for explaining a method of conducting a defective bit determination test in a test mode of the MRAM according to the second embodiment.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

Figure 1:
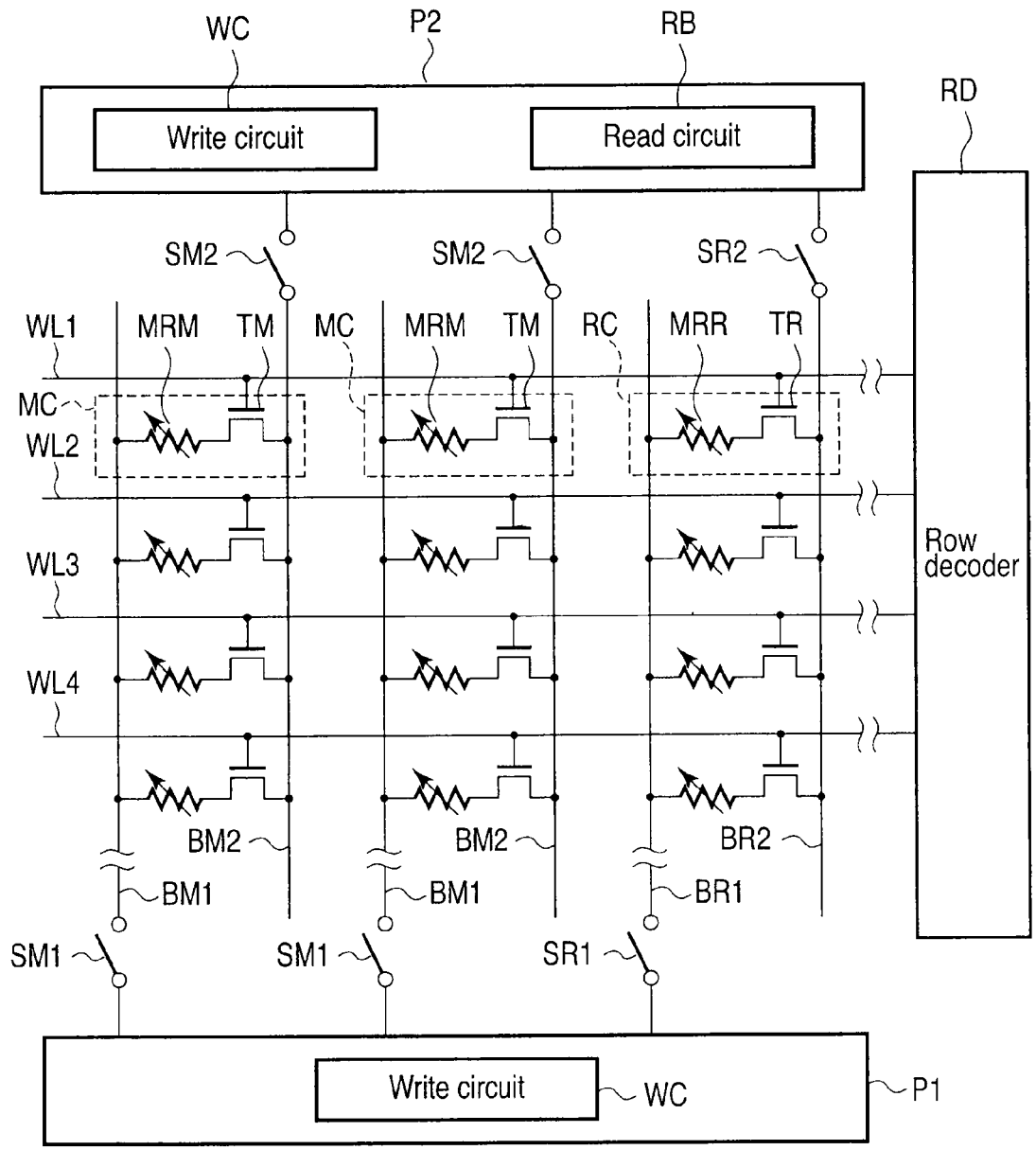
FIG. 1 is a circuit diagram showing a structural example of a semiconductor memory device (MRAM) according to a first embodiment of the present invention.

FIG. 1 shows a structural example of a semiconductor memory device according to a first embodiment of the present invention. It is to be noted that a magnetic random access memory (MRAM) as a resistance change memory including a test circuit for a magnetoresistive effect (MR) element that functions as a memory cell is taken as an example and a primary part thereof will be explained in this embodiment.

As shown in FIG. 1, a plurality of memory cells MC and a plurality of reference cells RC are arranged in the form of a matrix in a memory cell array. The memory cell MC is formed of an MR element MRM and a select transistor TM connected in series. The reference cell RC is formed of an MR element MRR and a select transistor TR connected in series. Each of the select transistors TM and TR is formed of, e.g., an n-type metal oxide semiconductor field-effect transistor (MOSFET).

Each of the MR element MRM and MRR is a resistance change element that can take at least two steady states in accordance with an internal magnetization state. More specifically, the MR element MRM or MRR is configured to take a low-resistance state or a high-resistance state when an electron flow of electrons subjected to spin polarization (spin-polarized electrons) is supplied from one to the other of two terminals or from the other to the one of the two terminals. When one of the two resistance states is associated with data "0" and the other state is associated with data "1", each of the MR elements MRM and MRR can store binary data.

The MR element MRR in the reference cell RC is formed by the same process as that of the MR element MRM in the memory cell MC. Therefore, these elements have the same film thickness and the same material. However, the MR element MRR is configured in such a manner that the internal magnetization state does not substantially vary.

Figure 2:
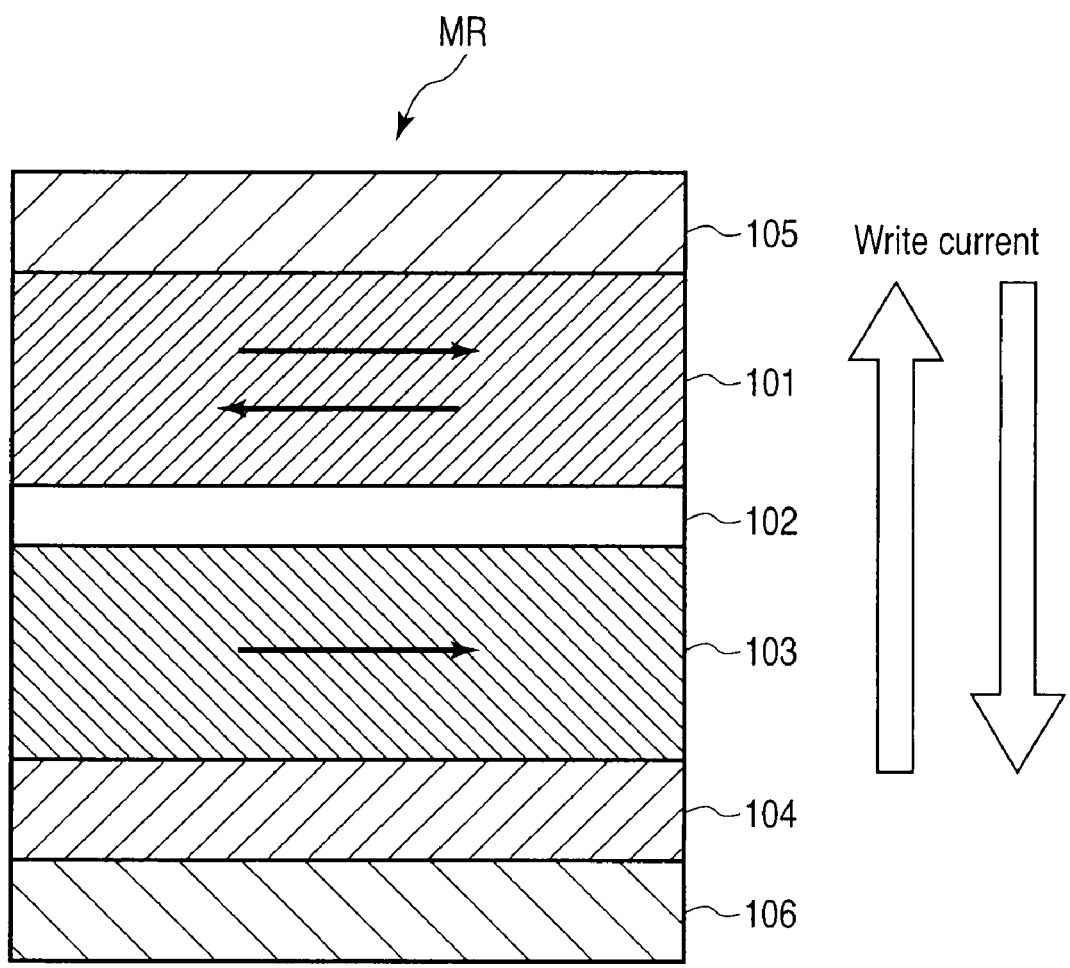
FIG. 2 is a cross-sectional view showing a structural example of an MR element in the MRAM according to the first embodiment.

The MR elements MRM and MRR will now be explained with reference to FIG. 2. FIG. 2 is a cross-sectional view of the MR element MR that can be utilized as the MR element MRM or MRR. As the most typical example, the MR element MR includes at least a fixed layer 103 formed of a ferromagnetic material, an intermediate layer 102 formed of a non-magnetic material, and a free layer (a recording layer) 101 formed of a ferromagnetic material that are sequentially laminated as shown in, e.g., FIG. 2. The free layer 101 and (or) the fixed layer 103 can have a laminated structure including a plurality of sub-layers.

A magnetizing direction of the fixed layer 103 is fixed. This can be realized by, e.g., providing an antiferromagnetic layer (a securing mechanism) 104 on a surface of the fixed layer 103 opposite to the intermediate layer 102.

On the other hand, in regard to the free layer 101, such a securing mechanism is not provided. Therefore, a magnetizing direction of the free layer 101 is variable. An axis of easy magnetization of the free layer 101 and the magnetizing direction of the fixed layer 103 face a direction along surfaces with which the free layer 101, the intermediate layer 102, and the fixed layer 103 are in contact. That is, the MR element MR has, e.g., so-called in-plane magnetization.

Further, electrodes 105 and 106 may be provided on a surface of the free layer 101 opposite to the intermediate layer 102 and a surface of the antiferromagnetic layer 104 opposite to the fixed layer 103, respectively.

In order to reverse magnetization of the free layer 101 facing a direction antiparallel to the magnetizing direction of the fixed layer 103 so that magnetization of the free layer 101 faces a direction parallel to the magnetizing direction of the fixed layer 103, an electron flow is passed toward the free layer 101 from the fixed layer 103. Conversely, in order to reverse magnetization of the free layer 101 facing the direction parallel to the magnetizing direction of the fixed layer 103 so that magnetization of the free layer 101 faces the direction antiparallel to the magnetizing direction of the fixed layer 103, the electron flow is passed toward the fixed layer 103 from the free layer 101.

As the ferromagnetic material of the free layer 101 and the fixed layer 103, it is possible to use, e.g., Co, Fe, Ni, or an alloy including such materials. As the material of the antiferromagnetic layer 104, it is possible to use, e.g., Fe—Mn, Pt—Mn, Pt—Cr—Mn, Ni—Mn, Pd—Mn, NiO, $Fe_2O_3$, or a magnetic semiconductor.

As the intermediate layer 102, a non-magnetic metal, a non-magnetic semiconductor, or an insulating film can be used, for example. When using a non-magnetic metal for the intermediate layer 102, for example, one of Au, Cu, Cr, Zn, Ga, Nb, Mo, Ru, Pd, Ag, Hf, Ta, W, Pt, or Bi, or an alloy including one selected from these materials can be used. Furthermore, in order to cause the intermediate layer 102 to function as a tunnel barrier layer, for example, $Al_2O_3$, $SiO_2$, MgO, or AlN can be used.

It is to be noted that the MR element MR may have a shape (a structure) obtained by turning a shape depicted in FIG. 2 upside down. Moreover, magnetization of the free layer 101 and the fixed layer 103 may be parallel to a direction piercing each layer in the MR element MR. That is, the MR element MR may have so-called vertical magnetization.

The MRAM is constituted to enable supplying a current in a direction along which the cell MR element MRM is set to a low-resistance state and a current in a direction along which the same is set to a high-resistance state to the MR element (the cell MR element) MRM in an arbitrary memory cell MC. Passing such currents can be realized by various structures, and the present invention is not restricted thereto. One example will now be explained hereinafter.

For example, as shown in FIG. 1, an arbitrary column (e.g., a third column in FIG. 1) is assigned for the reference cell RC. The free layer 101 of the MR element MRR in the reference cell RC is configured to avoid magnetization reversal, and it is fixed, for example.

Each terminal (e.g., the MR element side) of the memory cell MC and the reference cell RC is connected with a bit line BM1 or BR1. Each bit line BM1 or BR1 is connected with a peripheral circuit P1 through a switch circuit SM1 or SR1. Peripheral circuit P1 includes a write circuit WC.

Each of the other terminals (e.g., the select transistor side) of the memory cell MC and the reference cell RC is connected with a bit line BM2 or BR2. Each bit line BM2 or BR2 is connected with a peripheral circuit P2 through a switch circuit SM2 or SR2. Peripheral circuit P2 includes a write circuit WC and a read circuit RB.

Switch circuit SM1 or SM2 is turned on/off in accordance with a signal associated with an address signal that specifies a memory cell MC as an access target. Additionally, each of switch circuits SR1 and SR2 is turned on at the time of reading. Each of switch circuits SM1, SM2, SR1, and SR2 is formed of, e.g., an MOSFET. Further, peripheral circuit P1 or P2 is electrically connected with a memory cell MC as an access target when switch circuit SM1 or SM2 connected with bit line BM1 or BM2 connected with the memory cell MC as the access target is turned on.

The write circuit WC includes a current source/sink circuit. The current source/sink circuit has a function of supplying a current to the connected bit line BM1 or BM2 and a function of extracting a current from the connected bit line BM1 or BM2.

A gate terminal (an electrode) of the select transistor TM or TR in an nth (n is a natural number) row is connected with a word line WLn. The word line WLn is connected with a row decoder RD. The row decoder RD drives the word line WLn specified by an address signal supplied from the outside of the MRAM.

The read circuit RB includes a supply circuit that supplies a read current, a sense amplifier, and others. The supply circuit for the read current supplies to the cell MR element MRM a current having an intensity that enables detection of data associated with a magnetization state maintained by the cell MR element MRM at the time of reading. The sense amplifier determines a resistance state from a current flowing through the MR element MRM or MRR.

In the example detected in FIG. 1, the write circuits WC are arranged at both ends of the memory cell array, respectively. However, the present invention is not restricted thereto, and the write circuit WC can be realized as any structure as long as it is a structure that enables passing bidirectional currents to an arbitrary memory cell MC as explained above. For example, the pair of write circuits WC may be arranged on the upper side or the lower side of the memory cell array.

Likewise, the read circuit RB is connected with an upper ends of bit lines BM2 and BR2 in the example shown in FIG. 1, but the present invention is not restricted to this example. An arbitrary conformation can be realized as long as it is a structure that enables determining a resistance state by passing a read current to the cell MR element MRM. For example, the read circuit RB may be connected with lower ends of bit lines BM2 and BR2, or may be connected with bit lines BM1 and BR1.

When writing data in a given memory cell MC, the select transistor TM in this memory cell MS as a write target is turned on, and switch circuits SM1 and SM2 connected with bit lines BM1 and BM2 in memory cell columns including this memory cell MC as the write target are turned on. Further, one of the two write circuits WC associated with write data functions as a current source circuit, and the other functions as a current sink circuit. As a result, a write current flows between the write circuits WC through switch circuit SM1, bit line BM1, the write target memory cell MC, bit line BM2, and switch circuit SM2.

FIG. 3 shows a structural example (a function block) of the read circuit including the test circuit. In this example, each of the sense amplifier SA, the memory cell MC, and the reference cell RC is mainly focused and shown in this example.

In FIG. 3, a drain terminal of an n-type MOSFET 10a for control over a read voltage of the memory cell MC is connected with one of complementary input nodes (a first node NM) of the sense amplifier SA. A voltage VCLMP is applied to a gate terminal of n-type MOSFET 10a. One memory cell MC selected from the plurality of memory cells MC in accordance with an address signal is connected with a source terminal of n-type MOSFET 10a.

On the other hand, a drain terminal of an n-type MOSFET 10b for control over a reference voltage of the reference cell RC is connected with the other of the complementary input nodes (a second node NR) of the sense amplifier SA. A voltage VREF is applied to a gate terminal of n-type MOSFET 10b. A reference voltage terminal (VSS) or one reference cell RC selected from the plurality of reference cells RC is connected with a source terminal of n-type MOSFET 10b through a switch circuit 11.

The switch circuit 11 is controlled by a controller 12. For example, in a regular mode (reading), the switch circuit 11 is switched to connect the reference cell RC to the source terminal of n-type MOSFET 10b. In a test mode, it is switched to connect the reference voltage terminal (VSS) to the source terminal of n-type MOSFET 10b.

It is to be noted that each MUX 13 depicted in the drawing is a circuit that controls connection of one memory cell MC selected from the plurality of memory cells MC with respect to, e.g., bit line BM1 or BM2, the word line WLn, or the like, and includes switch circuits SM1 and SM2. Further, the MUX 13 is a circuit that controls connection of one reference cell RC selected from the plurality of reference cells RC with respect to, e.g., bit line BR1 or BR2, the word line WLn, or the like, and includes switch circuits SR1 and SR2.

Furthermore, gate terminals (voltage VCLMP and voltage VREF) of the controller 12 and the n-type MOSFETs 10a and 10b are controlled by, e.g., an external tester (not shown).

In this embodiment, for example, a contact control circuit is formed of the switch circuit 11 and the controller 12, and the sense amplifier SA, n-type MOSFET 10b, the switch circuit 11, the controller 12, and the reference voltage terminal (VSS) constitute the test circuit.

An operation in a regular mode in such a structure will be first exampled. At the time of reading, the read voltage is adjusted to a value close to "VCLMP-a threshold value of n-type MOSFET 10a". The reference voltage is adjusted to a value close to "VREF-a threshold value of n-type MOSFET 10b". Furthermore, the switch circuit 11 is controlled by the controller 12, and the source terminal of n-type MOSFET 10b for control over the reference voltage is connected with the reference cell RC. As a result, a read current associated with the read voltage flows through the memory cell MC, and a reference current (Iref) associated with the reference voltage flows through the reference cell RC.

It is to be noted that the reference current is adjusted to an intermediate current corresponding to data "0" of the memory cell MC and a current corresponding to data "1" of the same based on voltage VREF. In this case, n-type MOSFET 10b functions as a source follower that controls the reference voltage.

Figure 4:
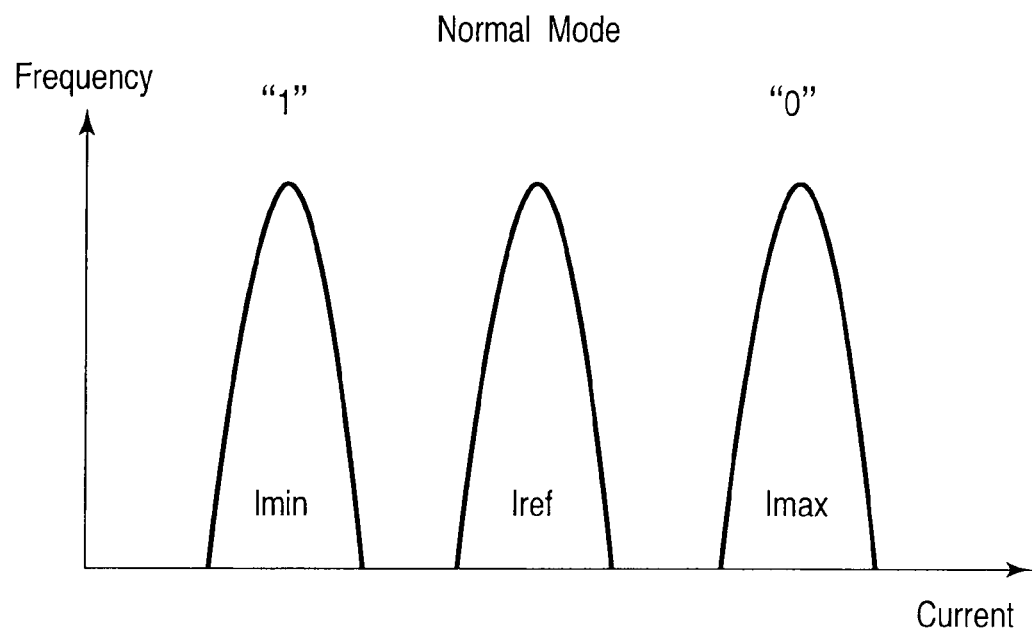
FIG. 4 is a view showing distributions of a read current and a reference current in a regular mode of the MRAM according to the first embodiment.

Here, the read currents (Imin, Imax) of the plurality of memory cells MC and the reference current (Iref) of the plurality of reference cells RC are distributed with fluctuations as shown in, e.g., FIG. 4. That is because a resistance of the memory cell MC and a resistance of the reference cell RC fluctuate. Considering an example where the MRAM is used in an environment where resistances are apt to vary due to, e.g., a fluctuation in temperature or a fluctuation in power supply voltage, a differential amplification scheme using the reference cell that allows a fluctuation in moderation but can expand an operation range is advantageous. However, using such a reference current Iref to accurately conduct a defective bit determination test is difficult.

Figure 5:
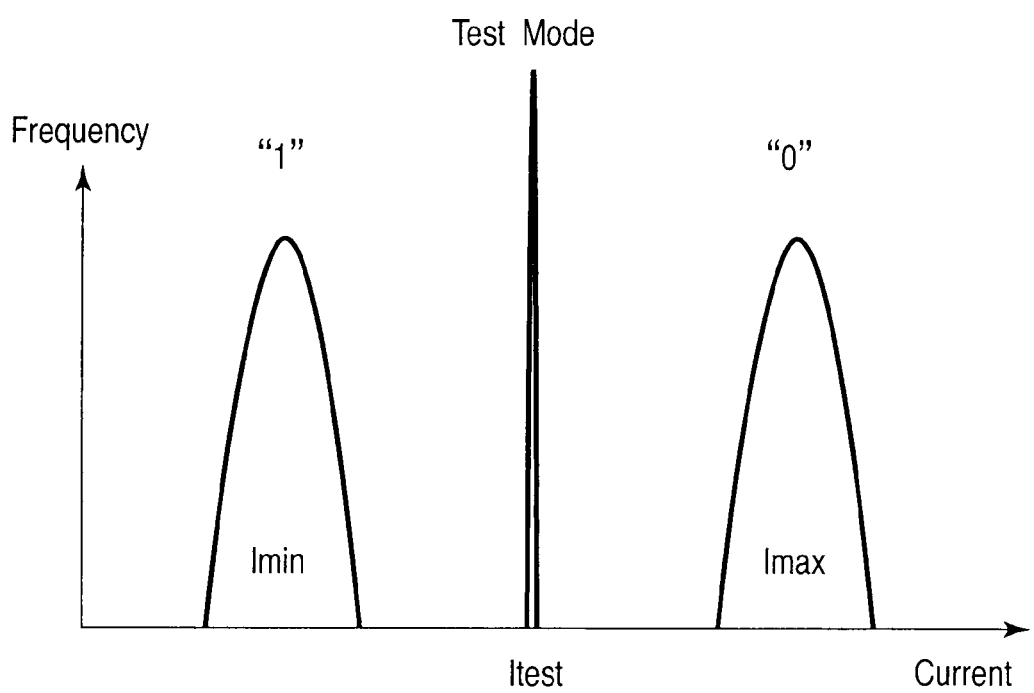
FIG. 5 is a view showing distributions of a read current and a reference current in a test mode of the MRAM according to the first embodiment.

An operation in a test mode will now be explained. A difference from the regular mode is that the source terminal of n-type MOSFET 10b for control over the reference voltage is connected with the reference voltage terminal (VSS). That is, the switch circuit 11 is switched from the reference cell RC side to the reference voltage terminal (VSS) side by the controller 12. As a result, the reference current (a test current Itest) in the test mode is adjusted based on voltage VREF alone without being dependent on the reference cell. In this case, n-type MOSFET 10b functions as a constant current source that supplies the reference current. Therefore, as shown in, e.g., FIG. 5, since reference current Itest in the test mode does not have a fluctuation like that in the regular mode, the defective bit determination test can be accurately conducted.

Figure 6:
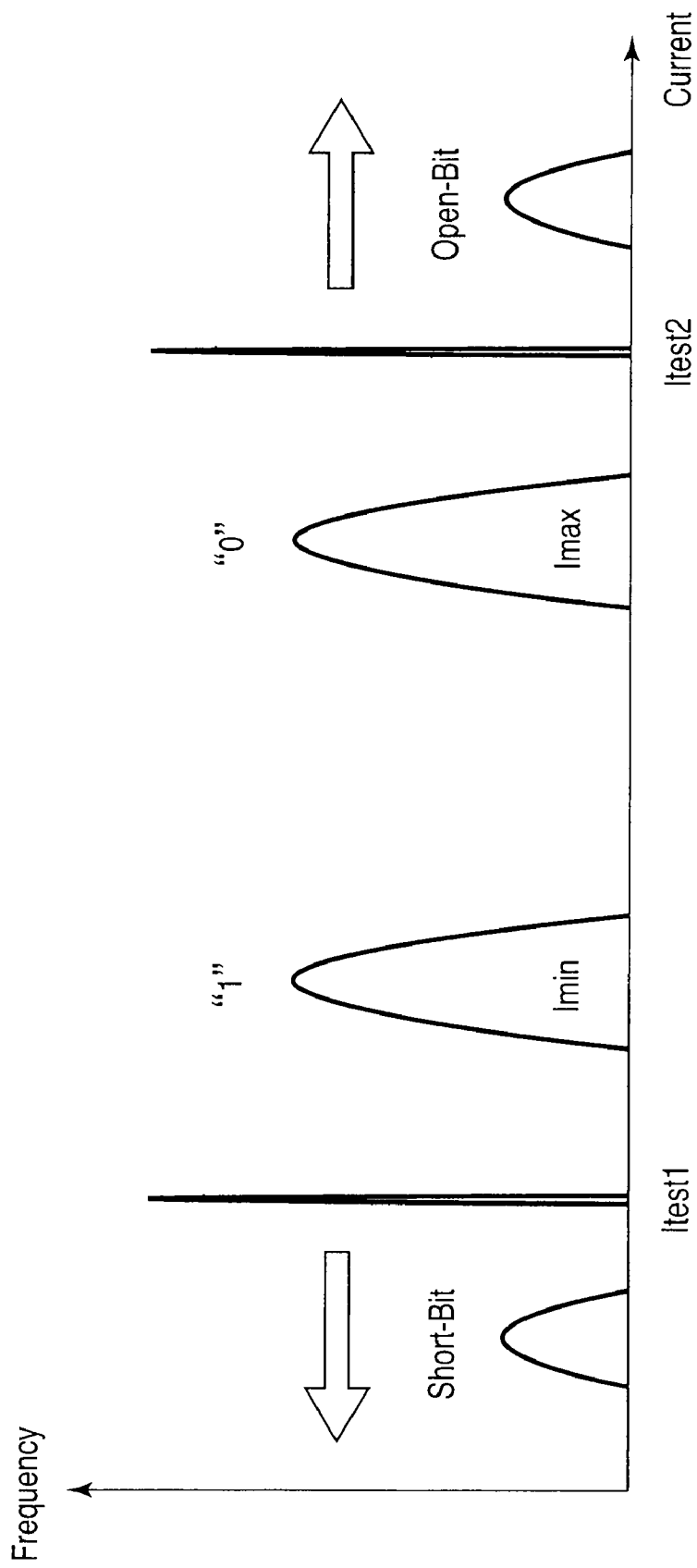
FIG. 6 is a view for explaining a method of conducting a defective bit determination test in the test mode of the MRAM according to the first embodiment.

FIG. 6 shows an example of the defective bit determination test in the test mode. For example, in order to determine a short bit, voltage VREF is used to adjust a reference current (a test current) Itest1 to have a value smaller than a distribution of a current (Imin) corresponding to normal data "1". Further, a bit of a read current (the memory cell MC) smaller than this reference current Itest1 is determined as the short bit by the sense amplifier SA. Likewise, to determine, e.g., an open bit, voltage VERF is used to adjust a reference current (a test current) Itest2 to have a value larger than a distribution of a current (Imax) corresponding to normal data "0". Furthermore, a bit of a read current (the memory cell MC) larger than this reference current Itest2 is determined as the open bit by the sense amplifier SA.

In reality, a sense output that becomes a short bit or an open bit is stored in the sense amplifier SA, and whether a corresponding bit (the memory cell MC) is a short bit or an open bit is determined in a non-illustrated external tester based on the sense output from the sense amplifier SA.

As explained above, in the test mode, the source terminal of the n-type MOSFET for control over the reference voltage is connected with the reference voltage terminal (VSS). As a result, the reference current in the test mode can be a current having no fluctuation like that in the regular mode. Therefore, such a fluctuation as that in the reference current in the regular mode can be suppressed, and the defective bit determination test of the MR element that functions as the memory cell can be accurately conducted.

Second Embodiment

Figure 7:
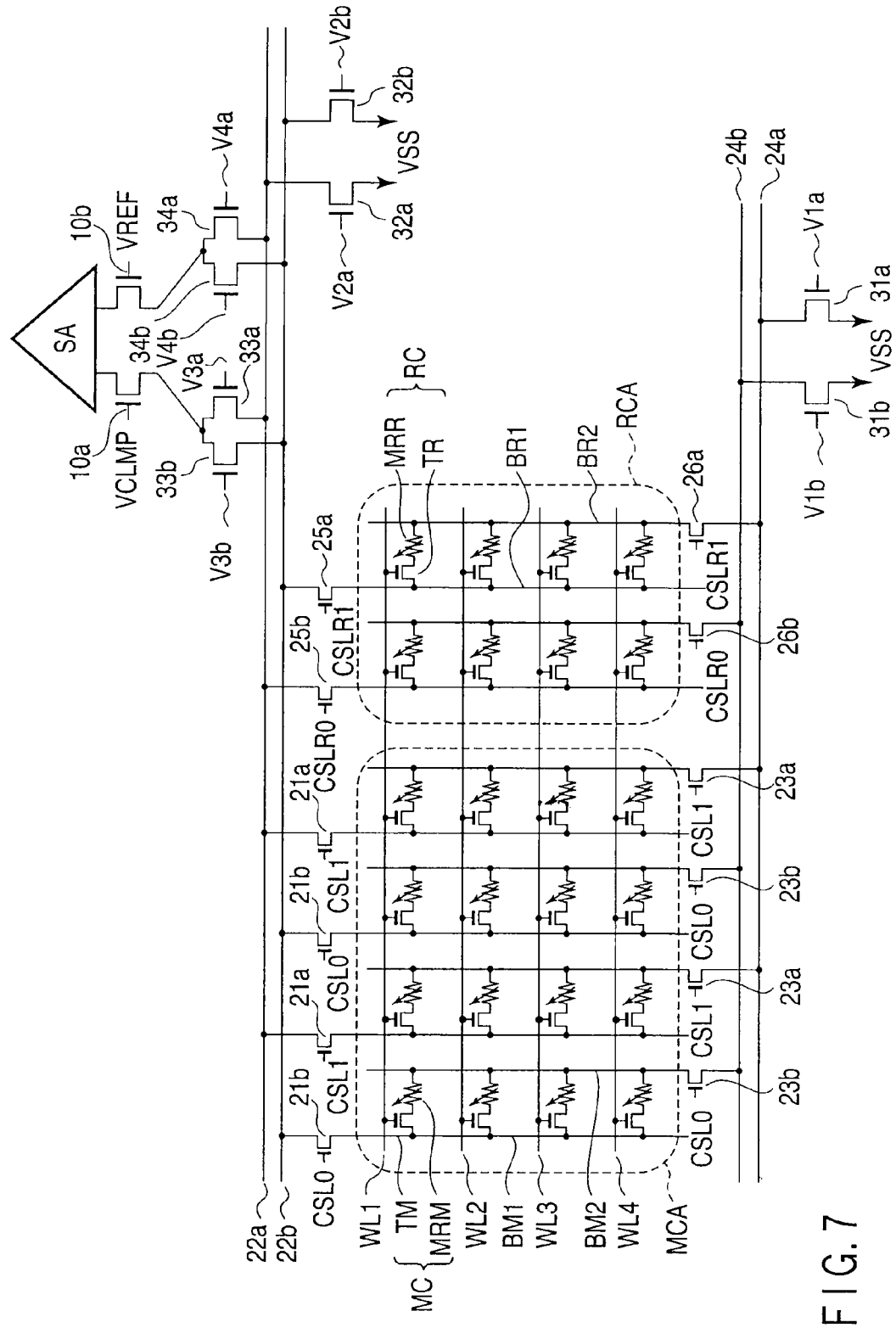
FIG. 7 is a circuit diagram showing a structural example of a semiconductor memory device (an MRAM) according to a second embodiment of the present invention.

FIG. 7 shows a structural example of a semiconductor memory device according to a second embodiment of the present invention. In this embodiment, a magnetic random access memory (MRAM) as a resistance change memory including a test circuit for a magnetoresistive effect (MR) element that functions as a memory cell or a reference cell will be taken as an example, and its primary part will be explained. It is to be noted that like reference numerals denote parts equal to those in the first embodiment, thereby omitting a detailed explanation.

As shown in FIG. 7, a data bus 22a is connected with bit lines BM1 associated with odd-numbered columns in a memory cell array MCA through main body column select transistors 21a, respectively. A bus 24a is connected with bit lines BM2 associated with the odd-numbered columns through main body column select transistors 23a, respectively. Further, a data bus 22b is connected with bit lines BM1 associated with even-numbered columns of the memory cell array MCA through main body column select transistors 21b, respectively. A bus 24b is connected with bit lines BM2 associated with the even-numbered columns through main body column select transistors 23b, respectively.

Each of main body column select transistors 21a and 23a is controlled by a main body column select signal CSL1 that is supplied to a gate through a column decoder (not shown). Each of main body column select transistors 21b and 23b is controlled by a main body column select signal CSL0 that is supplied to the gate from the column decoder.

On the other hand, data bus 22b is connected with a bit line BR1 associated with an odd-numbered column in a reference cell array RCA through a reference column select transistor 25a. The bus 24a is connected with a bit line BR2 associated with an odd-numbered column through a reference column select transistor 26a. Furthermore, data bus 22a is connected with a bit line BR1 associated with an even-numbered column in the reference cell array RCA through a reference column select transistor 25b. The bus 24b is connected with a bit line BR2 associated with the even-numbered column through a reference column select transistor 26b.

Each of reference column select transistors 25a and 26a is controlled by a reference column select signal CSLR1 that is supplied to a gate from the column decoder. Each of reference column select transistors 25b and 26b is controlled by a reference column select signal CSLR0 that is supplied to the gate from the column decoder.

A connection control transistor 31a is connected with the bus 24a, and a connection control transistor 31b is connected with the bus 24b. Connection control transistors 31a and 31b are controlled based on connection control signals V1a and V1b that are supplied to gates from a controller (which will be explained later), respectively. A reference voltage terminal (VSS) is connected with connection control transistors 31a and 31b.

Connection control transistors 32a, 33a, and 34a are connected with data bus 22a, and connection control transistors 32b, 33b, and 34b are connected with data bus 22b, respectively. Connection control transistors 32a and 32b are controlled based on connection control signals V2a and V2b that are supplied to gates by the controller, respectively. Connection control transistors 33a and 33b are controlled based on connection control signals V3a and V3b that are supplied to gates from the controller, respectively. Connection control transistors 34a and 34b are controlled based on connection control signals V4a and V4b that are supplied to gates from the controller, respectively. A reference voltage terminal (VSS) is connected with connection control transistors 32a and 32b.

Connection control transistors 33a and 33b are connected with one of complementary input nodes of a sense amplifier SA through an n-type MOSFET 10a for control over a read voltage of the memory cell MC. Connection control transistors 34a and 34b are connected with the other of the complementary input nodes of the sense amplifier SA through an n-type MOSFET 10b for control over a reference voltage of the reference cell RC.

In such a structure, for example, when a memory cell (a selected memory cell) MC as an access target is placed in an even-numbered column, a corresponding main body column select signal CSL0 is asserted (high), and a reference column select signal CSLR0 is also asserted. Moreover, when the selected memory cell MC is placed in an odd-numbered column, a corresponding main body column select signal CSL1 is asserted, and a reference column select signal CSLR1 is also asserted.

Additionally, in a regular mode, when the selected memory cell MC is in an even-numbered column, connection control signals V1b, V3b, and V4a are made high, and connection control signals V1a, V2a, V2b, V3a, and V4b are negated (low). Further, in the case of an odd-numbered column, connection control signals V1a, V3a, and V4a are made high, and connection control signals V1b, V2a, V2b, V3b, and V4a are made low.

On the other hand, in a test mode, when the selected memory cell MC is in an even-numbered column, connection control signals V1b, V2a, V3b, and V4a are made high, and connection control signals V1a, V2b, V3a, and V4b are made low. Furthermore, in the case of an odd-numbered column, connection control signals V1a, V2b, V3a, and V4b are made high, and connection control signals V1b, V2a, V3b, and V4a are made low.

That is, in the regular mode, a read current of the selected memory cell MC in the even-numbered column is supplied to one of the complementary input nodes of the sense amplifier SA through main body column select transistor 21b associated with an address signal, data bus 22b, connection control transistor 33b, and n-type MOSFET 10a for control over the read voltage. As a result, in the sense amplifier SA, this read current is compared with a reference current of the reference cell RC in the even-numbered column that is supplied to the other of the complementary input nodes of the sense amplifier SA through reference column select transistor 25b, data bus 22a, connection control transistor 34a, and n-type MOSFET 10b for control over the reference voltage. Further, a read current of the selected memory cell MC in the odd-numbered column is supplied to one of the complementary input nodes of the sense amplifier SA through main body column select transistor 21a associated with an address signal, data bus 22a, connection control transistor 33a, and n-type MOSFET 10a. As a result, in the sense amplifier SA, this read current is compared with a reference current of the reference cell RC in the odd-numbered column that is supplied to the other of the complementary input nodes of the sense amplifier SA through reference column select transistor 25a, data bus 22b, connection control transistor 34b, and n-type MOSFET 10b.

In the test mode, in the sense amplifier SA, a read current of the selected memory cell MC in the even-numbered column that is supplied to one of the complementary input nodes like the above is compared with a reference current (a test current) that is supplied to the other of the complementary input nodes through connection control transistor 32a, data bus 22a, connection control transistor 34a, and n-type MOSFET 10b. Moreover, a read current of the selected memory cell MC in the odd-numbered column that is supplied to one of the complementary input nodes like the above is compared with a reference current (a test current) that is supplied to the other of the complementary input nodes through connection control transistor 32b, data bus 22b, connection control transistor 34b, and n-type MOSFET 10b. In this manner, a defective bit determination test of the MR element MRM that functions as the memory cell MC can be conducted.

Additionally, in the case of the test mode, in the sense amplifier SA, a reference current of the reference cell RC in the even-numbered column that is supplied to the other of the complementary input nodes like the above is compared with a reference current (a test current) that is supplied to one of the complementary input nodes through connection control transistor 32b, data bus 22b, connection control transistor 33b, and n-type MOSFET 10a. Further, a reference current of the reference cell RC in the odd-numbered column that is supplied to the other of the complementary input nodes in the same manner as that explained above is compared with a reference current that is supplied to one of the complementary input nodes through connection control transistor 32a, data bus 22a, connection control transistor 33a, and n-type MOSFET 10a. In this manner, a defective bit determination test of the MR element MRR that functions as the reference cell RC can be also conducted.

Figure 8:
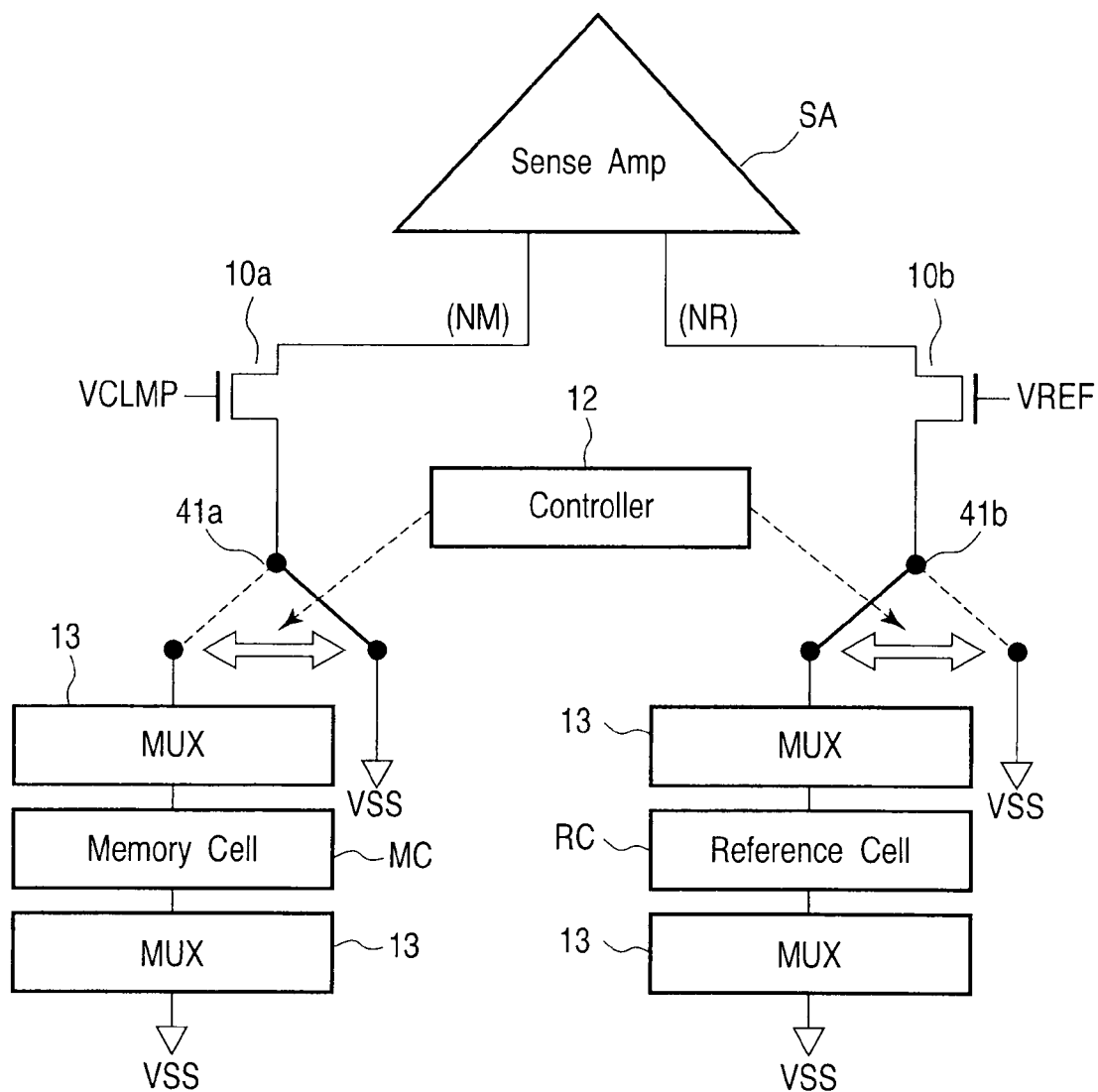
FIG. 8 is a structural view showing a test circuit of the MRAM according to the second embodiment.

FIG. 8 shows a structural example (a function block) of a read circuit including a test circuit. In this example, a sense amplifier SA, a memory cell MC, and a reference cell RC are mainly focused and shown one by one.

In FIG. 8, a drain terminal of an n-type MOSFET 10a for control over a read voltage of the memory cell MC is connected with one of complementary input nodes (a first node NM) of the sense amplifier SA. A voltage VCLMP is applied to a gate terminal of n-type MOSFET 10a. To a source terminal of n-type MOSFET 10a can be connected one memory cell MC that is selected from a plurality of memory cells MC in accordance with a reference voltage terminal (VSS) or an address signal through a switch circuit 41a.

On the other hand, a drain terminal of an n-type MOSFET 10b for control over a reference voltage of a reference cell RC is connected with the other of the complementary input nodes (a second node NR) of the sense amplifier SA. A voltage VREF is applied to a gate terminal of n-type MOSFET 10b. The reference voltage terminal VSS or one reference cell RC selected from a plurality of reference cells RC is connected with a source terminal of n-type MOSFET 10b through a switch circuit 41b.

Switch circuits 41a and 41b are formed of, e.g., connection control transistors 32a, 32b, 33a, 33b, 34a, and 34b, and controlled by a controller 12.

It is to be noted that each MUX 13 depicted in the drawing is a circuit that controls connection of one memory cell MC selected from the plurality of memory cells MC with respect to, e.g., a bit line BM1 or BM2 or a word line WLn, and includes main body column select transistors 21a, 21b, 23a, and 23b and connection control transistors 31a and 31b. Furthermore, the MUX 13 is a circuit that controls connection of one reference cell RC selected from the plurality of reference cells RC with respect to, e.g., a bit line BR1 or BR2 or a word line WLn, and includes reference column select transistors 25a, 25b, 26a, and 26b and connection control transistors 31a and 31b.

Moreover, the controller 12 and the gate terminals (voltage VCLMP and voltage VREF) of the n-type MOSFETs 10a and 10b are controlled by, e.g., an external tester (not shown).

In this embodiment, for example, switch circuits 41a and 41b and the controller 12 constitute a connection control circuit, and the sense amplifier SA, the n-type MOSFETs 10a and 10b, switch circuits 41a and 41b, the controller 12, and the reference voltage (VSS) constitute a test circuit.

FIG. 9 shows a structural example of the sense amplifier. In this embodiment, a current sense amplifier adopting, e.g., a differential amplification scheme is used.

As shown in FIG. 9, each terminal of (current paths of) p-type MOSFETs Qp11 and Qp12 is connected with a power supply potential terminal (VDD). Respective gate terminals of transistors Qp11 and Qp12 are connected with each other and also connected with a gate terminal of a p-type MOSFET Qp13. A control signal SE1 is supplied to a gate terminal of each of transistors Qp11, Qp12, and Qp13.

One terminal of transistor Qp13 is connected with the other terminal of transistor Qp11, and functions as a first output terminal OUT of the sense amplifier SA. The other terminal of transistor Qp13 is connected with the other terminal of transistor Qp12, and functions as a second output terminal /OUT of the sense amplifier SA. The potentials of the first output terminal OUT and the second output terminal /OUT have a complementary relationship.

A p-type MOSFET Qp14 and two n-type MOSFETs Qn21 and Qn22 are connected in series between a power supply potential terminal and a common potential terminal. Respective gate terminals of transistor Qp14 and transistor Qn21 are connected with each other, and also connected with the second output terminal /OUT. A connection node of transistor Qp14 and transistor Qn21 is connected with the first output terminal OUT.

A p-type MOSFET Qp15 and two n-type MOSFETs Qn23 and Qn24 are connected in series between the power supply potential terminal and the common potential terminal. Respective gate terminals of transistor Qp15 and transistor Qn23 are connected with each other, and also connected with the first output terminal OUT. A connection node of transistor Qp15 and transistor Qn23 is connected with a second output terminal /OUT.

A gate terminal of transistor Qn24 is connected with a gate terminal of transistor Qn22, and receives a control signal SE2.

A connection node of transistor Qn21 and transistor Qn22 functions as a first input terminal IN1. The first input terminal IN1 is connected with an n-type MOSFET 10a for control over a read voltage of the memory cells MC. A connection node of transistor Qn23 and transistor Qn24 functions as a second input terminal IN2. The second input terminal IN2 is also connected with an n-type MOSFET 10b for control over a reference voltage of the reference cell RC.

This sense amplifier SA is of a current differential amplification type (a differential amplification scheme), and operates as explained below. First, prior to an operation, the first and second output terminals OUT and /OUT are pre-charged to have a power supply potential VDD. Furthermore, when switch circuits 41a and 41b are respectively connected with the memory cell MC and the reference cell RC, a cell (read) current and a reference current are supplied to the sense amplifier SA. In this state, when the control signal SE1 is made low, a sense operation is started. As a result, the potential associated with data held in the memory cell MC appears in the first and second output terminals OUT and /OUT. Moreover, when an appropriate time passes, the potential at each of the first and second output terminals OUT and /OUT is determined by making control signal SE2 high.

FIG. 10 is a view showing an example of a defective bit determination test in a test mode. Since a method of conducting a defective bit determination test in the MR element MRM that functions as the memory cell MC is substantially the same as that explained in the first embodiment, an example where the reference cell RC is a test target alone will be explained herein.

In the test mode, for example, as shown in FIG. 8, the reference voltage terminal (VSS) is connected with the source terminal of n-type MOSFET 10a for control over the read voltage of the memory cell MC, and the reference cell RC is connected with the source terminal of n-type MOSFET 10b for control over the reference voltage of the reference cell RC. In this case, n-type MOSFET 10a functions as a constant current source that is controlled by voltage VCLMP, and n-type MOSFET 10b functions as a source follower that controls the reference voltage in accordance with voltage VREF.

As shown in FIG. 10, for example, each of a bit of a reference current smaller than a reference current (a test current) Itest1 and a bit of a reference current larger than a reference current (a test current) Itest2 is determined as a defective reference cell RC (Tail Bit), reference current Itest1 and reference current Itest2 being present at both ends of a reference current (Iref) distribution, for example. The reference cell RC determined as a defective can be substituted by a redundant reference cell closer to the center of the reference current distribution in the same array RCA, for example.

As explained above, in this embodiment, since the reference cell RC can be likewise set as a test target, an effect of providing this test mode is great in a case where the reference current cannot be stably generated in a given reference cell.

According to the structure of this embodiment, a fluctuation like that in the reference current in the regular mode can be suppressed, and the defective bit determination test of the MR element functioning as the memory cell can be accurately conducted. Additionally, the defective bit determination test of the MR element that functions as the reference cell can be also accurately conducted.

It is to be noted that the MRAM has been taken as the example in each of the foregoing embodiments, but the present invention is not restricted thereto. For example, the present invention can be likewise applied to various kinds of resistance change type memories, e.g., a PRAM or an ReRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a sense amplifier that compares intensities of currents flowing through a first node and a second node with each other;
a first metal oxide semiconductor field effect transistor (MOSFET) having a drain terminal connected with the first node;
a second MOSFET having a drain terminal connected with the second node;
a memory cell connected with a source terminal of the first MOSFET;
a reference cell; and
a connection control circuit that connects a source terminal of the second MOSFET with the reference cell during a regular operation and connects the source terminal of the second MOSFET with a reference voltage terminal during a test operation,
wherein during a test operation of the memory cell, the semiconductor memory device supplies a test current that differs from a current during the regular operation to the second node by controlling a voltage of a gate terminal of the second MOSFET and compares the test current with a current that reflects a resistance state of the memory cell and is supplied to the first node.

2. The device according to claim 1, wherein the connection control circuit has:
a switch circuit connected with the source terminal of the second MOSFET; and
a control circuit that controls to switch the reference cell connected with one contact of the switch circuit and the reference voltage terminal connected with the other contact depending on the regular operation and the test operation.

3. The device according to claim 1, wherein the memory cell is formed of a magnetoresistive effect element and a select transistor connected in series, and
the magnetoresistive effect element is a resistance change element and configured to take at least two steady states in accordance with an internal magnetization state.

4. The device according to claim 3, wherein the magnetoresistive effect element is formed by sequentially laminating a first ferromagnetic material layer having a fixed magnetizing direction, a non-magnetic material layer, and a second ferromagnetic material layer having a variable magnetizing direction.

5. The device according to claim 1, wherein the reference cell is formed of a magnetoresistive effect element and a select transistor connected in series, and
the magnetoresistive effect element is a resistance change element and has an internal magnetization state that does not substantially vary.

6. The device according to claim 5, wherein the magnetoresistive effect element is formed by sequentially laminating a first ferromagnetic material layer having a fixed magnetizing direction, a non-magnetic material layer, and a second ferromagnetic material layer having a fixed magnetizing direction.

7. A semiconductor memory device comprising:
a sense amplifier that compares intensities of currents flowing through a first node and a second node with each other;
a first metal oxide semiconductor field effect transistor (MOSFET) having a drain terminal connected with the first node;
a second MOSFET having a drain terminal connected with the second node;
a reference cell connected with a source terminal of the second MOSFET;
a memory cell; and
a connection control circuit that connects a source terminal of the first MOSFET with the memory cell during a regular operation and connects the source terminal of the first MOSFET with a reference voltage terminal during a test operation,
wherein during a test operation of the reference cell, the semiconductor memory device supplies a test current that differs from a current during the regular operation to the first node by controlling a voltage of a gate terminal of the first MOSFET and compares the test current with a current that reflects a resistance state of the reference cell and is supplied to the first node.

8. The device according to claim 7, wherein the connection control circuit has:
a switch circuit connected with the source terminal of the first MOSFET; and
a control circuit that controls to switch the memory cell connected with one contact of the switch circuit and the reference voltage terminal connected with the other contact depending on the regular operation and the test operation.

9. The device according to claim 7, wherein the memory cell is formed of a magnetoresistive effect element and a select transistor connected in series, and
the magnetoresistive effect element is a resistance change element and configured to take at least two steady states in accordance with an internal magnetization state.

10. The device according to claim 9, wherein the magnetoresistive effect element is formed by sequentially laminating a first ferromagnetic material layer having a fixed magnetizing direction, a non-magnetic material layer, and a second ferromagnetic material layer having a variable magnetizing direction.

11. The device according to claim 7, wherein the reference cell is formed of a magnetoresistive effect element and a select transistor connected in series, and
the magnetoresistive effect element is a resistance change element and has an internal magnetization state that does not substantially vary.

12. The device according to claim 11, wherein the magnetoresistive effect element is formed by sequentially laminating a first ferromagnetic material layer having a fixed magnetizing direction, a non-magnetic material layer, and a second ferromagnetic material layer having a fixed magnetizing direction.

13. A semiconductor memory device comprising:
a sense amplifier that compares intensities of currents flowing through a first node and a second node with each other;
a first metal oxide semiconductor field effect transistor (MOSFET) having a drain terminal connected with the first node;
a second MOSFET having a drain terminal connected with the second node;
a memory cell;
a reference cell; and
a connection control circuit that connects a source terminal of the first MOSFET with the memory cell and connects a source terminal of the second MOSFET with a reference cell during a regular operation,
the connection control circuit connects the source terminal of the first MOSFET with the memory cell and connects the source terminal of the second MOSFET with a reference voltage terminal, or connects the source terminal of the second MOSFET with the reference cell and connects the source terminal of the first MOSFET with the reference voltage terminal during a test operation,
wherein during a test operation of the memory cell, the semiconductor memory device supplies a test current that differs from a current during the regular operation to the second node by controlling a voltage of a gate terminal of the second MOSFET and compares the test current with a current that reflects a resistance state of the memory cell and is supplied to the first node, and
wherein during a test operation of the reference cell, the semiconductor memory device supplies a test current that differs from a current during the regular operation to the first node by controlling a voltage of a gate terminal of the first MOSFET and compares the test current with a current that reflects a resistance state of the reference cell and is supplied to the first node.

14. The device according to claim 13, wherein the connection control circuit has:
a switch circuit connected with the source terminal of the second MOSFET; and
a control circuit that controls to switch the reference cell connected with one contact of the switch circuit and the reference voltage terminal connected with the other contact depending on the regular operation and the test operation.

15. The device according to claim 13, wherein the connection control circuit has:
a switch circuit connected with the source terminal of the first MOSFET; and
a control circuit that controls to switch the memory cell connected with one contact of the switch circuit and the reference voltage terminal connected with the other contact depending on the regular operation and the test operation.

16. The device according to claim 13, wherein the memory cell is formed of a magnetoresistive effect element and a select transistor connected in series, and the magnetoresistive effect element is a resistance change element and configured to take at least two steady states in accordance with an internal magnetization state.

17. The device according to claim 16, wherein the magnetoresistive effect element is formed by sequentially laminating a first ferromagnetic material layer having a fixed magnetizing direction, a non-magnetic material layer, and a second ferromagnetic material layer having a variable magnetizing direction.

18. The device according to claim 13, wherein the reference cell is formed of a magnetoresistive effect element and a select transistor connected in series, and the magnetoresistive effect element is a resistance change element and has an internal magnetization state that does not substantially vary.

19. The device according to claim 18, wherein the magnetoresistive effect element is formed by sequentially laminating a first ferromagnetic material layer having a fixed magnetizing direction, a non-magnetic material layer, and a second ferromagnetic material layer having a fixed magnetizing direction.

* * * * *